United States Patent
Neo et al.

(10) Patent No.: US 10,699,923 B2
(45) Date of Patent: Jun. 30, 2020

(54) TRANSFER SYSTEM FOR FLIPPING AND MULTIPLE CHECKING OF ELECTRONIC DEVICES

(71) Applicant: MIT SEMICONDUCTOR PTE LTD, Singapore (SG)

(72) Inventors: Siong Huat Neo, Singapore (SG); Kim Mone Kwong, Singapore (SG); Kok Yeow Lim, Singapore (SG); Zhi Qiang Mao, Singapore (SG)

(73) Assignee: MIT SEMICONDUCTOR PTE LTD, Singapore (SG)

(*) Notice: Subject to any disclaimer, the term of this patent is extended or adjusted under 35 U.S.C. 154(b) by 0 days.

(21) Appl. No.: 16/096,166

(22) PCT Filed: Apr. 27, 2016

(86) PCT No.: PCT/SG2016/050196
§ 371 (c)(1),
(2) Date: Oct. 24, 2018

(87) PCT Pub. No.: WO2017/188889
PCT Pub. Date: Nov. 2, 2017

(65) Prior Publication Data
US 2019/0139795 A1  May 9, 2019

(51) Int. Cl.
*H01L 21/67* (2006.01)
*B65G 47/84* (2006.01)
(Continued)

(52) U.S. Cl.
CPC ...... *H01L 21/67144* (2013.01); *B65G 47/848* (2013.01); *H01L 21/67259* (2013.01); *H01L 21/681* (2013.01); *H01L 21/6838* (2013.01)

(58) Field of Classification Search
CPC .... B65G 47/846; B65G 47/848; B65G 90/00; B65G 90/02; H01L 21/76144; H01L 21/67259; H01L 21/681; H01L 21/6838
(Continued)

(56) References Cited

U.S. PATENT DOCUMENTS 6,227,345 B1    5/2001  Miyamoto
9,218,995 B2 *  12/2015 Cheng ............... H01L 21/67718
(Continued)

FOREIGN PATENT DOCUMENTS

CN      1575120 A    2/2005
CN    103367208 A   10/2013
(Continued)

OTHER PUBLICATIONS

International Search Report for PCT/SG2016/050198, ISA/SG, Singapore, dated Jul. 25, 2016.
(Continued)

*Primary Examiner* — Ronald P Jarrett
(74) *Attorney, Agent, or Firm* — Harness, Dickey & Pierce, P.L.C.

(57) ABSTRACT

The present invention includes a transfer system for flipping and checking electronic devices. A first rotary device has a plurality of transfer heads configured to pick electronic devices from a wafer table and place the electronic devices on a transfer head of a second rotary device. Check stations can be positioned around the first and second rotary devices and configured to inspect or check the electronic devices during the flipping process. The transfer system can further include an imaging device to inspect the accuracy of picking and placing of the electronic devices during the flipping process. The wafer table and the first rotary device are inclined to increase the operation space. The system accurately picks, flips and transfers chips at a high operation speed.

9 Claims, 7 Drawing Sheets

(51) Int. Cl.
*H01L 21/68* (2006.01)
*H01L 21/683* (2006.01)

(58) Field of Classification Search
USPC .................. 198/380, 392, 397.02, 803.5;
414/223.01, 752.1
See application file for complete search history.

(56) References Cited

U.S. PATENT DOCUMENTS

| 2008/0280453 | A1* | 11/2008 | Koelmel .......... H01L 21/67115 |
| | | | 438/758 |
| 2010/0040449 | A1 | 2/2010 | Blessing et al. |
| 2014/0102850 | A1 | 4/2014 | Cheng et al. |
| 2014/0328652 | A1 | 11/2014 | Cheng et al. |

FOREIGN PATENT DOCUMENTS

| GB | 2335640 B | 10/2000 |
| JP | 2006-306617 A | 11/2006 |
| WO | WO-03/058708 A1 | 7/2003 |

OTHER PUBLICATIONS

International Preliminary Report on Patentability (CH. II), IPEA Singapore, dated Jun. 8, 2017.

\* cited by examiner

TRANSFER SYSTEM FOR FLIPPING AND MULTIPLE CHECKING OF ELECTRONIC DEVICES

CROSS-REFERENCE TO RELATED APPLICATIONS

This application is a 371 U.S. National Stage of International Application No. PCT/SG2016/050196, filed Apr. 27, 2016, the entire disclosures of which are incorporated herein by reference.

FIELD OF THE INVENTION

The following description relates generally to a transfer system for transferring and changing the orientation of electronic devices such as semiconductor chips, and more specifically, to a system for transferring and flipping chips that provides additional operation space and greater efficacy than conventional systems.

BACKGROUND

Semiconductor device fabrication is the process used to create the integrated circuits that are present in everyday electrical and electronic devices. In typical semiconductor fabrication, integrated circuits ("ICs" or "chips") are built in large quantities on a single large wafer of semiconductor material, typically silicon. The individual chips are patterned with small pads of metal near their edges that serve as connections to a mechanical carrier. The chips are then cut out of the wafer and attached to carriers, typically via wire bonding such as thermosonic bonding. The wires used in the wire bonding eventually lead to pins on the outside of the carriers, which are attached to circuitry making up the electronic system.

A flip chip pin grid array (FCPGA) is a form of pin grid array in which the die faces downwards on the top of the substrate with the back of the die exposed. The term "flip chip" can also refer to a controlled collapse chip connection which is a method for interconnecting semiconductor devices, such as IC chips and microelectromechanical systems (MEMS), to external circuitry with solder bumps that have been deposited onto the chip pads. The process is similar to conventional integrated circuit fabrication, but includes a few additional steps. Toward the end of the manufacturing process, attachment pads are metalized to make them more receptive to solder. Metalization typically includes several treatments. A small dot of solder is deposited on each metalized pad. The chips are then cut out of the wafer. To attach the flip chip into a circuit, the chip is inverted to bring the solder dots down onto connectors on underlying electronics or a circuit board. The solder is then re-melted to produce an electrical connection, typically using a thermosonic bonding, or alternatively, a reflow solder process.

During production, individual semiconductor chips are typically oriented such that their leads face away from the receiving surface. It may be necessary to "flip" the chips with a flipping mechanism before the chips are transferred for subsequent processes, such as function testing or visual integrity checking. Conventional flipping mechanisms increase the frequency by which the semiconductor packages are picked and placed, which increases the likelihood that packages are dropped and/or damaged.

For example, FIG. 1 depicts related art in which a pivoting part 3 is used for detaching individual semiconductor chips from a wafer or from its substrate 1 by means of a die ejector 2. The pivoting part 3 enables a flip head 5 to swivel by virtue of a pivotal point 4. A pickup element 6 is arranged on the flip head 5 out of an optical connection line 1c between a first optical facility 7 and the wafer surface. The related art shown in FIG. 1 comprises a pickup position 1a for the chip to be picked up and a deposit position 1b for a placing facility 8. The placing facility 8 includes a pickup element 9, which may take the form of a vacuum pipette, in order to place the turned chip within a smart card module, for example, by moving the placing facility 8. This system is impractical for industrial use because it has only one pickup element and relies on a time-consuming sequential method process.

FIG. 2, depicts a device for checking and rotating semiconductor chips according to another related art. The device includes a wafer (not shown) and an associated substrate 11 with a wafer surface 11a, from which individual semiconductor chips are ejected upwards with a die ejector 12 from below. A pivoting part 14 is arranged such that that it rotates in an executed rotation as indicated by arrows 15, 16 about a pivotal point 17, which is arranged above the chip to be picked up. The wafer can be moved with the substrate 11 in an X direction as indicated by arrows 13. The wafer can also be moved in a Y direction.

The pivoting part 14 includes cheek projections 18a and 18b and two opposite pickup elements 19, 20, which may take the form of vacuum pipettes. The pickup elements 19, 20 enable simultaneous picking up and depositing of two semiconductor chips. The first vacuum pipette 19 is configured to pick up a semiconductor chip from the substrate 11, while the pickup element 20 is configured to deposit another semiconductor chip on a placing facility 21. The placing facility 21 may be equipped with a vacuum pipette 22. In operation, the placing facility 21 is moved sideways as indicated by the double arrow 24. At almost the same time, the pivoting part 14 rotates about its pivotal point 17, this time in the opposite direction. After a 90° rotation of the pivoting part 14, an opening (not shown) is created in the pivoting part 14 to form a sight channel 23a. The sight channel 23a runs vertically through the part 14 from a first optical facility 23 to the surface 11a of the substrate 11, which is covered with a wafer of a second semiconductor chip.

This sight channel 23a enables the optical facility 23 to record the step of the second semiconductor chip being picked up on the substrate 11, and enables the surface and position of the second semiconductor chip to be checked. As soon as the pivoting part 14 has finished a 90° rotation followed by a 180° rotation, pickup of the second semiconductor chip is executed by the second vacuum pipette 20. A second optical facility (not shown) may take the form of a die positioned on the fly camera 25 and may be configured to check a flip offset of the previously rotated chip. In the event that there is a flip offset, the second optical facility calculates corresponding correction data and passes the data to the self-adjusting place element 21. The place element 21 then deposits the chip in an indexer 26. The position of the place element 21 is checked by a second camera 27. The device of FIG. 2 uses only two vacuum pipettes to flip the chip, hence the device is only capable of flipping a limited number of units per hour (UPH).

Related art US 20140328652 A1 discloses a transfer apparatus for transferring electronic devices from a wafer to a test handler. The transfer apparatus comprises a rotary device rotatable about an axis and a plurality of holders configured to hold the electronic devices for transfer from the wafer to the test handler. The holders are coupled to, and extendable from, the rotary device to pick the electronic devices from the wafer. Specifically, the plurality of holders are arranged circumferentially around, and inclined with respect to, the axis of the rotary device, so as to change an orientation of the electronic devices on the wafer to a desired orientation of the electronic devices on the test handler. Because the transfer apparatus uses a vertical wafer table, chips are prone to falling from the wafer and becoming damaged.

Another related art, WO 2003058708 A1, discloses a flip bonder having a pick-up turret assembly with a number of pick-up nozzles, and a placing turret assembly with a number of placing nozzles. Each pick-up nozzle picks a die by its bumped surface, and indexes the picked die to the transfer location, thereby flipping the picked die. At the transfer location, the picked die is transferred to a placing nozzle, with die now held by its back surface. The placing nozzle is indexed to a fluxing location where flux is applied to the die, and further indexed to a placing location, where the fluxed die is placed on a target location on a lead frame, with the bumps abutting lead portions of the lead frame. The multiple nozzles allow concurrent operations with each die, thus supporting an improved throughput. However, because there is only one vertical flipper, it is only possible to have one check station.

A need, therefore, exists for a system capable of quickly and accurately picking, flipping and transferring chips without dropping or damaging them. It should also provide increased operation space so that chips can be examined or checked by multiple devices such as cameras.

SUMMARY OF THE INVENTION

The following summary is provided to facilitate an understanding of some innovative features and is not intended to be a full description. An appreciation of the various aspects disclosed herein can be gained by considering the specification, claims, drawings, and abstract.

A transfer system for flipping and checking electronic devices includes a wafer table inclined about a first angle with respect to a horizontal axis. A first rotary device is rotatable about a second angle, and the first rotary device includes a plurality of first transfer heads circumferentially arranged around the first rotary device and inclined with respect to an axis of said first rotary device. The transfer heads are configured to pick and hold the electronic devices from the wafer table and transfer the electronic devices to a second rotary device.

The second rotary device is rotatable about a vertical axis, and includes a plurality of second transfer heads vertically arranged on a circumference of the second rotary device. The rotary device is configured to pick the electronic devices from the first rotary device and transfer the electronic devices to a handling device.

The transfer system further includes a first imaging device configured to inspect the electronic devices to be picked from the wafer table. A second imaging device is configured to inspect the electronic devices to be placed on the handling device. A plurality of check stations positioned around the first and second rotary devices are configured to check at least one parameter of the electronic devices held by at least one of the first and second transfer heads after picking the electronic devices from the wafer table.

Each of the first transfer heads is configured to pick the electronic devices and place the electronic devices on one of the second transfer heads at an interval of 180 degrees of rotation.

In one aspect, the electronic devices include semiconductor chips.

In another aspect, the first angle is in the range of 1 to 89 degrees.

In another aspect, the second angle is in the range of 1 to 89 degrees.

In another aspect, the first imaging device includes a camera, a first light source, and a first reflecting device.

In another aspect, the camera is a downward facing camera positioned above the wafer table.

In another aspect, the first imaging device and the first light source are positioned along an axis of the first imaging device.

In another aspect, the first reflecting device is configured to increase an inspection time of the electronic devices when picking the electronic devices from the wafer table.

In another aspect, the first reflecting device is configured to reflect light from the light source to an axis of one of the transfer heads.

In another aspect, the transfer system further includes at least one first suction device connected to the first transfer heads. The suction device is configured to provide suction force to each one of the first transfer heads when picking the electronic devices from the wafer table.

In another aspect, the transfer system further includes at least one second suction device connected to the second transfer head. The second suction device is configured to provide suction force to each of the plurality of second transfer heads when picking the electronic devices from the second transfer heads.

In another aspect, the first suction device is configured to provide sufficient suction force to hold the electronic devices during a flipping process.

In another aspect, the second suction device is configured to provide sufficient suction force to hold the electronic devices during a flipping process.

We also describe a transfer apparatus for flipping and checking electronic devices, comprising a wafer table for placing electronic devices, a first rotary head positioned at a right angle the said wafer table for picking the electronic devices from the wafer, the first rotary head composed of a plurality of first transfer heads. A second rotary head is positioned substantially vertically, for picking the electronic devices from the first rotary head. The second rotary head is also composed of a plurality of second transfer heads. A handling device receives electronic devices from the second rotary head. One or more imaging devices are configured to inspect the electronic devices and one or more check stations are configured to check at least one parameter of the electronic devices. The electronic devices are rotated 180 degrees when transferred from the first rotary head to the second rotary head.

The electronic devices include integrated circuits and semiconductor chips. The imaging devices can be comprised of a camera, a first light source and a first reflecting device. Further, the camera can be a downward facing camera positioned above the wafer table. The first imaging device and the first light source can be positioned along an axis of the first imaging device. A first suction device can be connected to the first transfer heads, configured to provide suction force to each of the transfer heads when picking electronic devices from the wafer table. A second suction device can be connected to the second transfer heads, configured to provide suction force to each of the second transfer heads.

BRIEF DESCRIPTION OF THE DRAWINGS

The summary above, as well as the following detailed description of illustrative embodiments, is better understood when read in conjunction with the appended drawings. For the purpose of illustrating the present disclosure, exemplary constructions of the disclosure are shown in the drawings. However, the disclosure is not limited to specific methods and instrumentalities disclosed herein. Moreover, those in the art will understand that the drawings are not to scale. Wherever possible, like elements have been indicated by identical numbers.

DETAILED DESCRIPTION OF THE INVENTION

Figure 1:
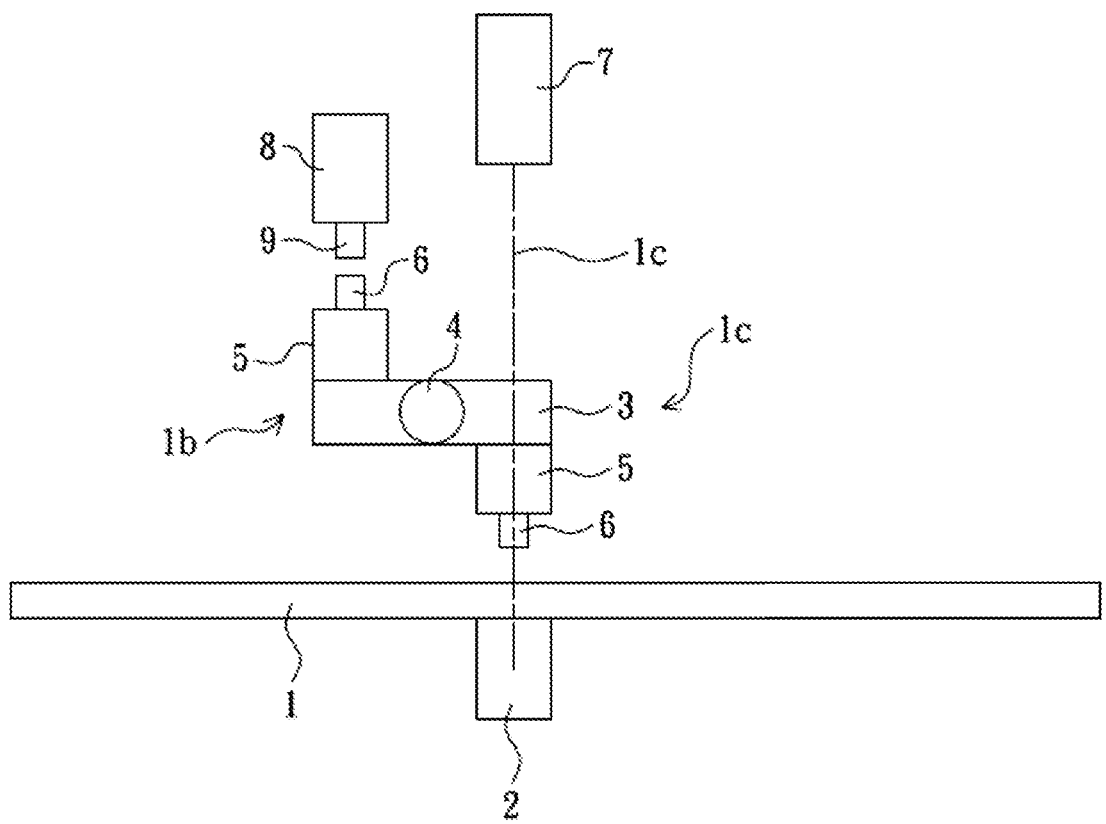
FIG. 1 shows a schematic front view of a device for checking and rotating semiconductor chips according to related art.
Figure 2:
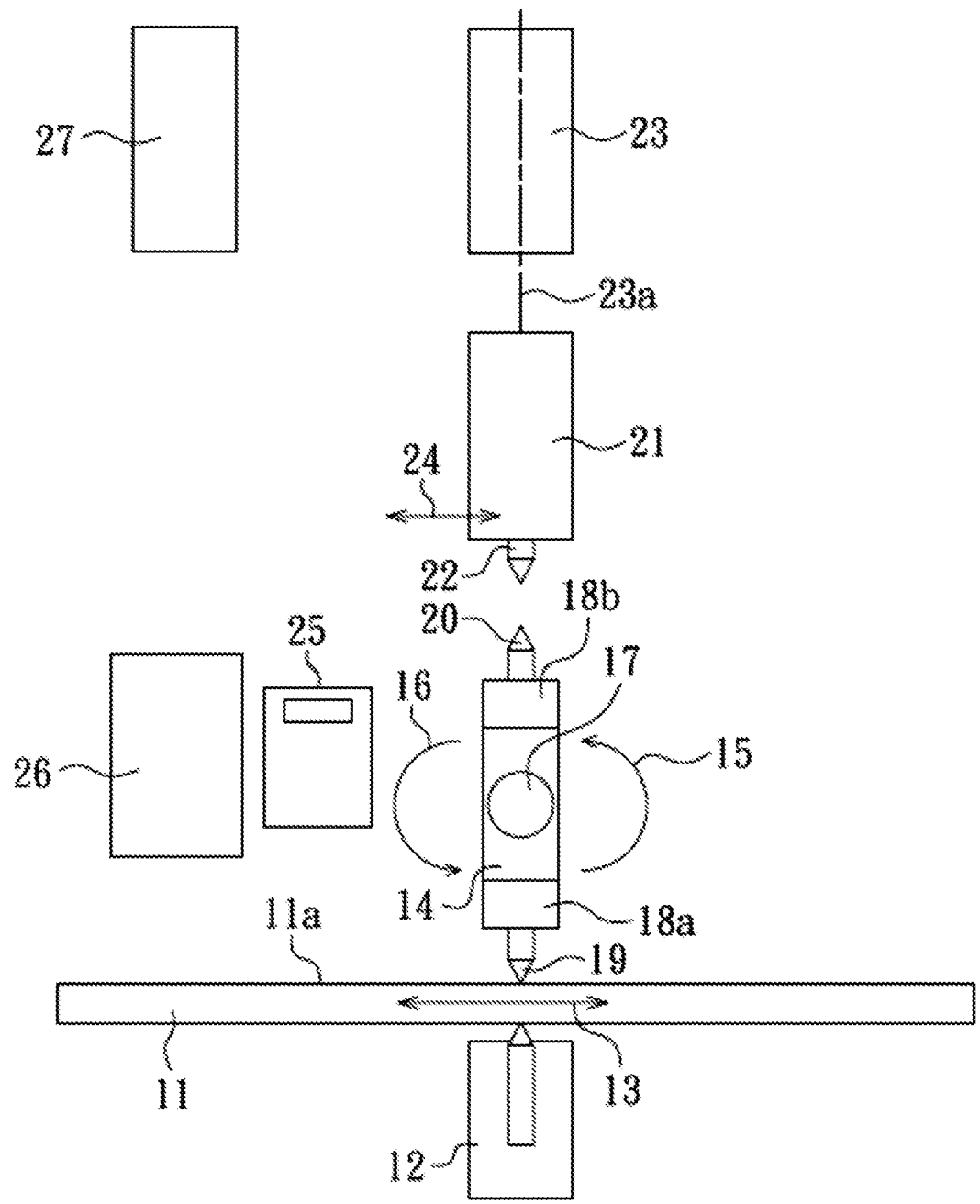
FIG. 2 shows a schematic front view of a device for checking and rotating semiconductor chips according to related art.

The particular values and configurations discussed in the following non-limiting examples can be varied, are cited merely to illustrate at least one embodiment, and are not intended to limit the scope thereof.

Without intent to further limit the scope of the disclosure, examples of instruments, apparatus, methods and their related results according to the embodiments of the present disclosure are given below. Note that titles or subtitles may be used in the examples for convenience of a reader, which in no way should limit the scope of the disclosure. Unless otherwise defined, all technical and scientific terms used herein have the same meaning as commonly understood by one of ordinary skill in the art to which this disclosure pertains. In the case of conflict, the present document, including definitions, will control.

The term "ball grid array" or "BGA" as used herein, refers to type of surface-mount packaging (a chip carrier) used for integrated circuits.

The term "electronic device," as used herein, refers to a single chip or a die cut from a semiconductor wafer.

The term "integrated circuit," as used herein, refers to a small complex of electronic components and their connections that is produced in or on a small slice of material such as silicon.

The term "operation space," as used herein, refers to the space available to test, examine, photograph, alter or manipulate an electronic device during the fabrication process.

The term "pick and place" or "PnP" as used herein, refers to surface mount technology (SMT) component placement systems, which are robotic machines used to place surface-mount devices (SMDs) onto a printed circuit board (PCB).

The term "semiconductor chip," as used herein, refers to an integrated circuit or monolithic integrated circuit (also referred to as an IC, a chip, or a microchip) which is a set of electronic circuits on one small plate ("chip") of semiconductor material, normally silicon.

The term "wafer table," as used herein, refers to a type of handling system, which must reliably, securely, and selectively position and hold a wafer or chip relative to elements of a processing system.

It will be appreciated that terms such as "front," "back," "top," "bottom," "side," "short," "long," "up," "down," and "below" used herein are merely for ease of description and refer to the orientation of the components as shown in the figures. It should be understood that any orientation of the components described herein is within the scope of the present invention.

Other technical terms used herein have their ordinary meaning in the art that they are used, as exemplified by a variety of technical dictionaries.

DESCRIPTION OF PREFERRED EMBODIMENTS

The invention includes a transfer system for flipping and checking electronic devices. The design presents several advantages over conventional systems including:

(1) a higher speed of operation (increased number of units per hour (UPH),
(2) a better optical line by inserting a mirror and lighting device between the rotating chips to increase the inspection time,
(3) increased operation space due to the angled turret and wafer table,
(4) the opportunity to place multiple checking stations around the heads,
(5) the ability to easily observe the operation and condition of the machine, and
(6) a greater efficacy over conventional designs as chips are less prone to being dropped or damaged.

Figure 3:
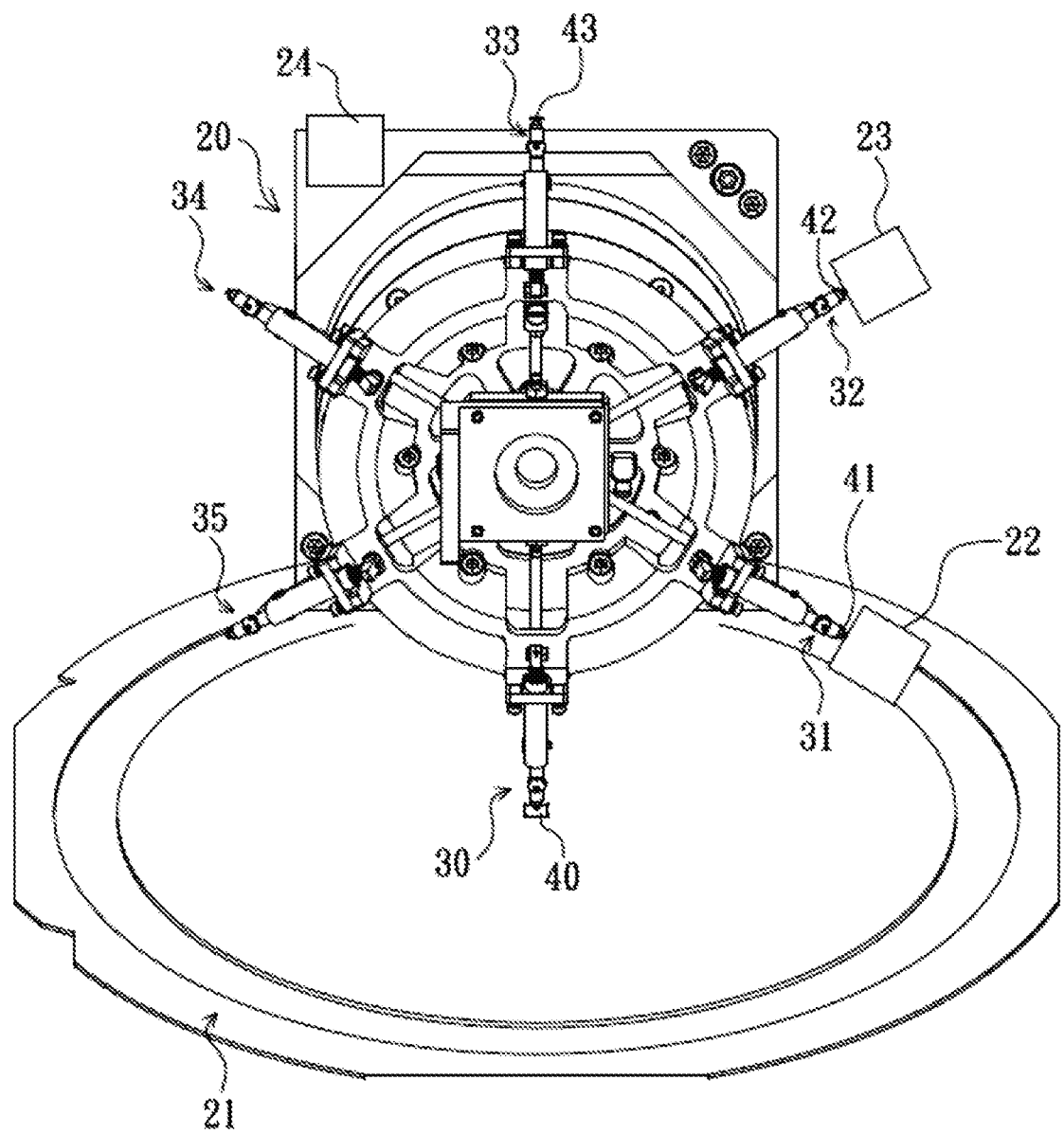
FIG. 3 shows a schematic front view of an inclined wafer table and first rotary device for flipping and checking electronic devices.

FIG. 3 shows a schematic front view of a wafer table 21 and a first rotary device 20 for flipping and checking of electronic devices. The first rotary device 20 has a plurality of circumferentially arranged first transfer heads 30, 31, 32, 33, 34 and 35. The wafer table 21 is inclined at a first angle with respect to a horizontal axis and the first rotary device 20 is inclined at a second angle with respect to the horizontal axis. The wafer table 21 can include a collection of electronic devices to be flipped. The first transfer head 30 of the first rotary device 20 is configured to pick an electronic device 40 to be flipped from the wafer table 21. It should be noted that the first transfer heads 31, 32 and 33 already hold the electronic devices 41, 42 and 43 to be flipped, respectively. FIG. 3 also shows a plurality of check stations 22, 23 and 24 that are positioned around the first rotary device 20. In the exemplary embodiment shown in FIG. 3, the check stations 22 and 23 are arranged in front of the first transfer heads 31 and 32. The check stations 22 and 23 are configured to check at least one parameter of the electronic devices 41 and 42 held by the first transfer heads 31 and 32, after picking the electronic devices 41 and 42 from the wafer table 21 via the respective first transfer heads 31 and 32.

In one embodiment, the first angle ranges from 1 to 89 degrees, preferably between 10 and 84 degrees, or more preferably 30 degrees. The angle of the wafer table is an important consideration for optimal use of the system. With a higher angle (more vertical), the electronic device is more likely to fall. With a lower angle there is less operation space. For example, with an angle of 45 degrees from horizontal, the wafer table may not be able to support the weight of the electronic device. When the first angle is between 35 degrees and 40 degrees, the electronic device can slip. When the angle is below 30 degrees, there is less operation space for arranging the devices used for flipping and checking the electronic devices. Hence, an optimal first angle is 30 degrees.

In another embodiment, the second angle ranges from 1 to 89 degrees. Although the embodiment of the first rotary device shown in FIG. 3 is an angled turret having six transfer heads, a skilled artisan will recognize that a similar design with a different number of heads could also be used without limitation.

Figure 4:
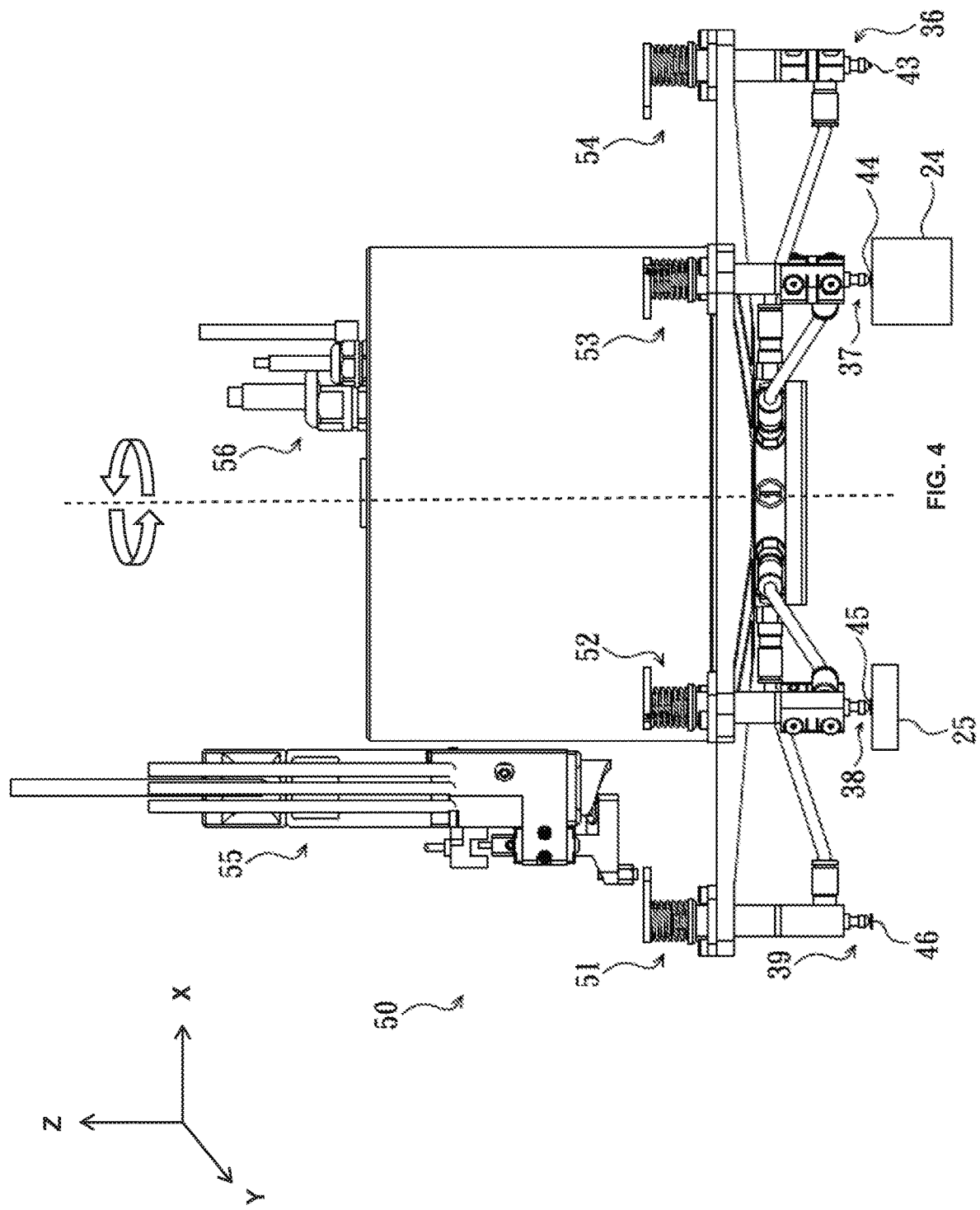
FIG. 4 shows a schematic front view of a second rotary device for flipping and checking electronic devices.

FIG. 4 shows a schematic front view of a second rotary device 50 utilized in flipping and checking the electronic devices 43, 44, 45, 46. Similar to the first rotary device 20, the second rotary device 50 has a plurality of circumferentially arranged transfer heads 36, 37, 38 and 39. Although the embodiment of FIG. 4 includes four heads, any number of heads can be used. The second rotary device 50 is configured to rotate about its vertical axis. Each first transfer head 30, 31, 32, 33, 34 and 35 is configured to rotate 180 degrees and to place the electronic devices on the plurality of second transfer heads 36, 37, 38 and 39 of the second rotary device 50, after picking the electronic devices from the wafer table 21. In one embodiment, the second rotary device 50 has six second transfer heads.

According to the embodiments shown in FIG. 3 and FIG. 4, when the first rotary device 20 is rotated about its axis, the first transfer head 30 is configured to pick the electronic device 40 from the wafer table 21. The first transfer heads 31 and 32 are configured to hold the already picked electronic device 41 and 42, and the first transfer head 33 is configured to place the electronic device 43 on the second transfer head 36 of second transfer device 50.

It should be noted that to flip the electronic devices, each first transfer head is rotated 180 degrees after picking the electronic devices. Furthermore, the electronic device 43 is placed at 180 degrees on the second transfer head 36 of the second rotary device. As shown in FIG. 4, the second transfer head 36 of the second rotary device 50 is configured to receive the electronic device 43 from the first transfer heads 33 of the first rotary device 20. It will be recognized by those skilled in the art that the first and second rotary devices 20 and 50 can have an equal or different number of transfer heads for flipping the electronic devices. Depending on the number of transfer heads in the first and second rotary devices 20 and 50, rotational speed of the first and second rotary devices 20 and 50 are adjusted such that the electronic devices picked by the first transfer head 30, 31, 32 or 33 of first rotary devices 20 are transferred to the second transfer head 36, 37, 38 or 39 of the second rotary device 50.

In one embodiment, the check station 24 is arranged in front of the second transfer head 37. As shown in FIG. 4, the check station 24 is configured to check at least one parameter of the electronic devices 44 held by the second transfer head 37 after receiving the electronic devices 44 from one of the first transfer heads 30, 31, 32, 33, 34 or 35 of the first rotary device 20. The check stations 22, 23 and 24 are stationary and are configured to check at least one parameter of the electronic device when the electronic device is held by at least one of first transfer heads 30, 31, 32, 33, 34 or 35 or the second transfer head 36, 37, 38 or 39 travels in front of the respective check stations 22, 23 or 24. Flipping accuracy and the condition of the electronic device can be determined from measured parameters.

The second rotary device 50 may be a Pick and Place (PnP) turret with six transfer heads, although other devices may also be used without limitation. The check station 22, 23 and 24 may comprise one or more sensors, cameras, and the like, to check at least one parameter of the electronic device.

Figure 5:
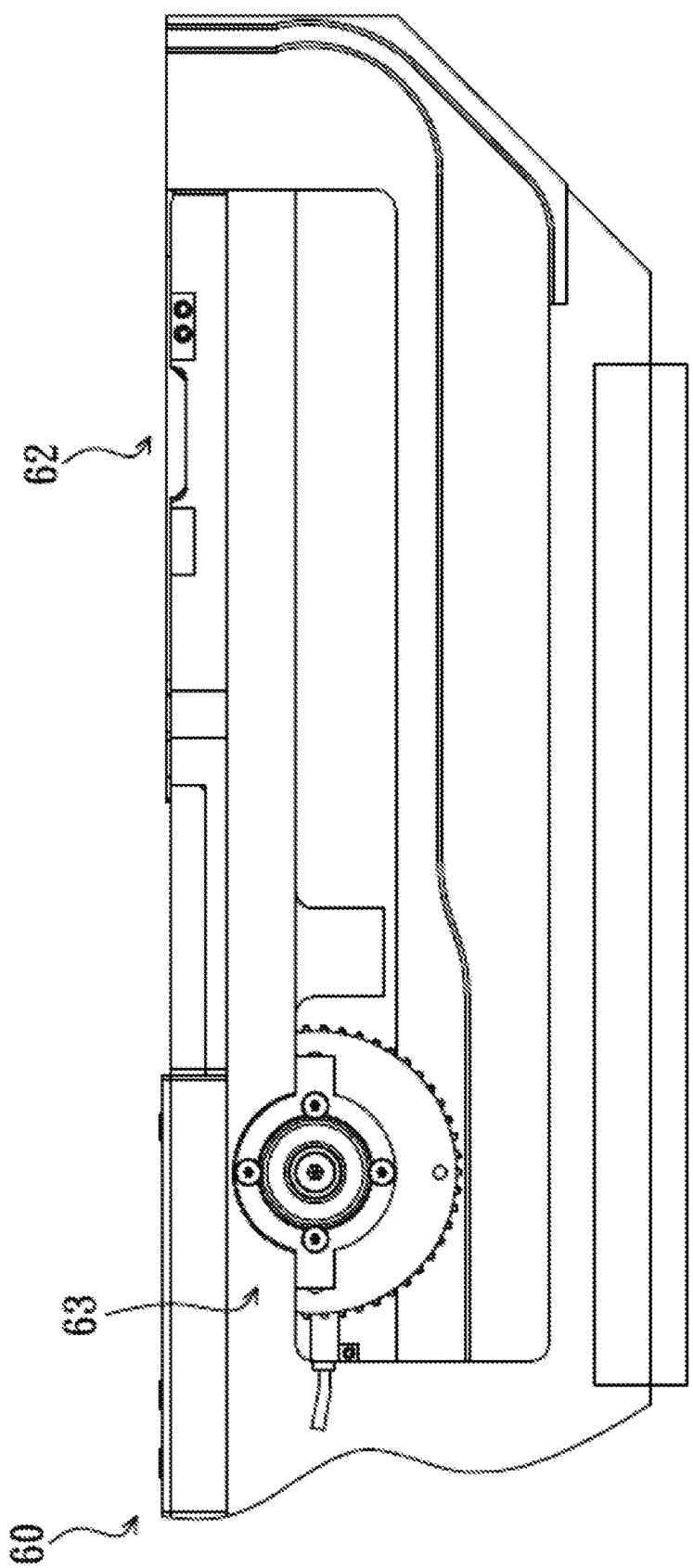
FIG. 5 shows a schematic front view of a handling device for receiving a flipped electronic device from second rotary device of FIG. 4.

FIG. 5 shows a schematic front view of a handling device 60 configured to receive the flipped electronic device from the second rotary device 50. The handling device 60 has an upper portion 62 on which the flipped electronic device can be placed or transferred. The handling device 60 has one or more conveyors 63 for moving the upper portion 62. The upper portion 62 is configured to unload the electronic device whenever the second transfer head 36, 37, 38 or 39 of the second rotary device 50 places the electronic device on the upper portion 62. The handling device 60 can be, for example, a track system or a carrier tape. The carrier tape can include a pocket to contain the electronic device (i.e. die).

Figure 6:
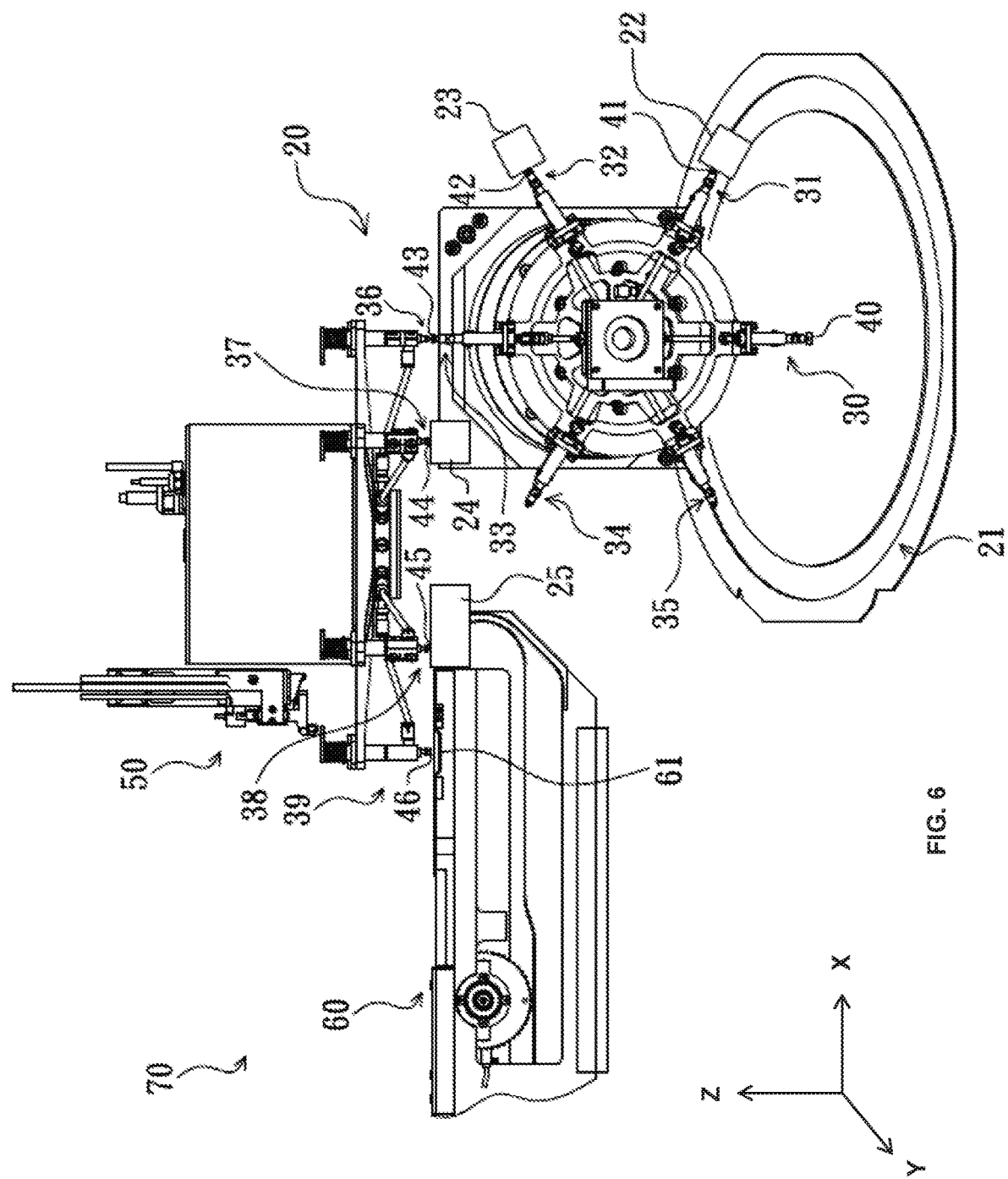
FIG. 6 shows a schematic front view of a transfer system for flipping and checking electronic devices.
Figure 7:
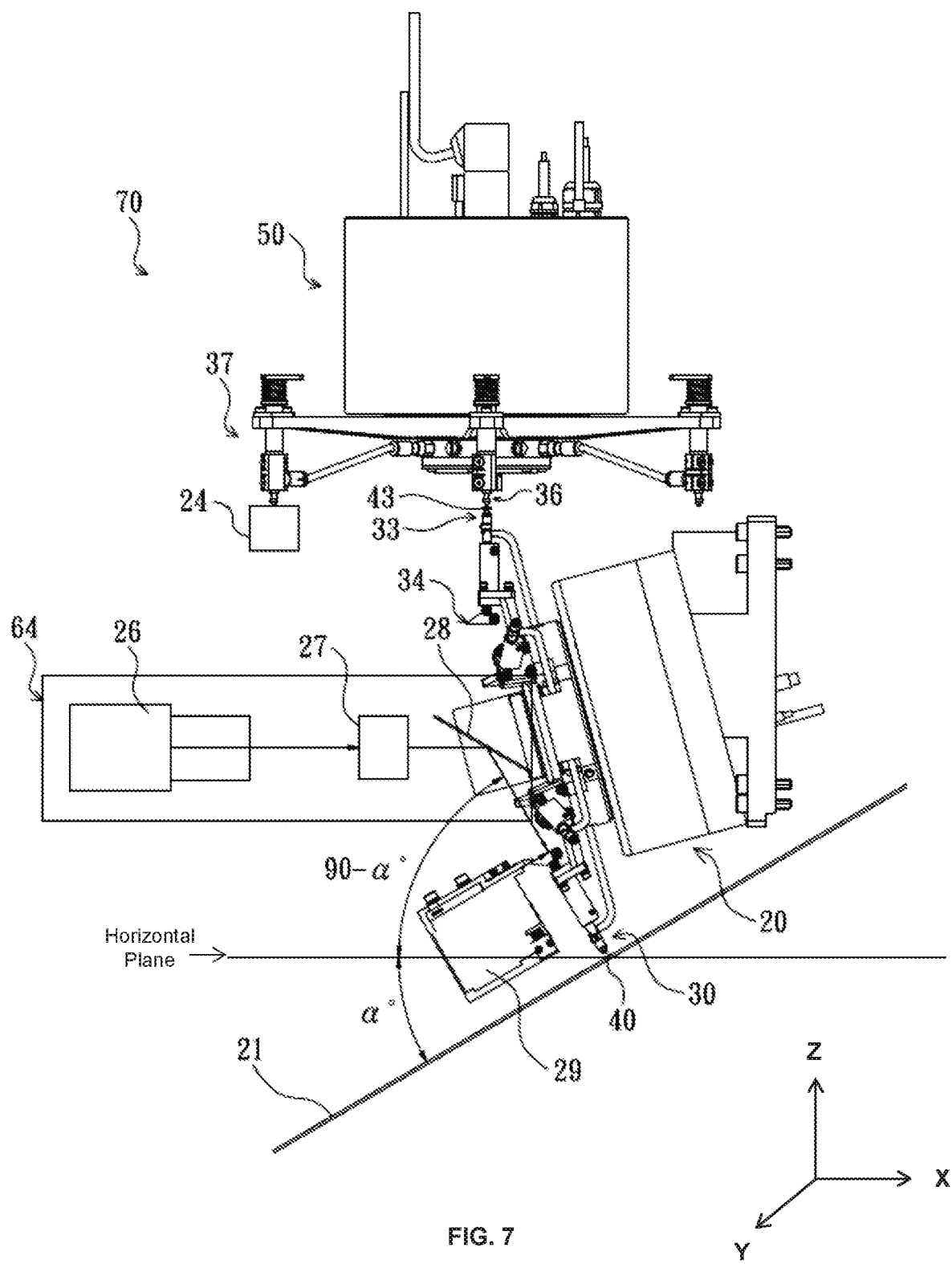
FIG. 7 shows a schematic side view of the transfer system depicted in FIG. 6.

FIG. 6 and FIG. 7 depict an embodiment of a transfer system 70 for flipping and checking electronic devices. The transfer system 70 includes the wafer table 21, the first rotary device 20, the second rotary device 50, and the handling device 60. The first transfer heads 30, 31, 32, 33, 34 or 35 are configured to pick any combination of the electronic devices 40, 41, 42 or 43 from the wafer table 21. After rotating 180 degrees, first transfer heads 30, 31, 32, 33, 34 or 35 can transfer the electronic device to one of the second transfer heads 36, 37, 38 or 39 of the second rotary device 50. The second transfer head 36, 37, 38 or 39 of the second rotary device 50 can then transfer the flipped electronic device onto the upper portion 61 of the handling device 60.

As shown in the embodiment of FIG. 7, the transfer system 70 can use at least one first imaging device 64 positioned above the wafer table 21 to image and inspect the electronic device to be picked from the wafer table 21. The first imaging device 64 comprises at least one camera 26, at least one first light source 27, and at least one first reflecting device 28. The camera 26 and the first light source 27 are positioned along same axis. The first reflecting device 28 is configured to increase the inspection time of electronic devices while the electronic devices are picked from the wafer table 21. The first reflecting device 28 reflects the light from the first light source 27 to an axis of the first transfer head 30 that picks the electronic device 40. The first imaging device 64 may be configured to inspect whether the electronic device and the first transfer head are properly aligned for pickup.

The camera 26 is configured to image the electronic device from above when the wafer table is picked for inspection. In one embodiment, the first reflecting device 28 is a mirror. However, other reflecting devices can also be used without limitation.

Similar to the first imaging device 64, the transfer system 70 can also have a second imaging device 25. The second imaging device 25 can include a camera, which may be, for example, an upward facing camera configured to inspect the flipped electronic device placed on the handling device 60. In one embodiment, the second imaging device 25 also includes at least one light source, at least one reflecting device, and at least one camera.

The first imaging device 64 and the second imaging device 25 can include any number of cameras. In one embodiment, at least one downward facing camera is used to check the position of the electronic device to facilitate picking the electronic device. If one of the first transfer heads 30, 31, 32, 33, 34 or 35 is set to be a check station, then there can also be a camera for that station.

In one embodiment, the first imaging device 64 and the second imaging device 25 act as a check station. Images obtained from the cameras of the check station can be used to detect the position of the chip on the check station for adjustment before placing the electronic device into the handling device. The images can also be used to test a weld ball on a top face of the electronic device (die) or the side face of the electronic device (die), etc., without limitation.

FIG. 7 shows a first suction device 29 connected to the first transfer head 30 of the first rotary device 20. The first suction device 29 is configured to provide sufficient force to the transfer head 30 when picking the electronic device 40 from the wafer table 21. It should be noted that the system 70 can have a single first suction device 29 connected to all first transfer heads 30, 31, 32, 33, 34 and 35 can provide controlled suction force for picking the electronic devices 40, 41, 42 or 43 from the wafer table 21. Further, the first suction device 29 also allows the first transfer heads 30, 31, 32, 33, 34 and 35 to hold the electronic devices 40, 41, 42 or 43 during 180 degree rotation, and also provides sufficient force to place the electronic devices 40, 41, 42 or 43 on the second transfer heads 30, 31, 32, 33, 34 or 35 of the second rotary device 50. In one embodiment, the first suction device 29 comprises a pick pusher force control device.

In one embodiment, each first transfer head 30, 31, 32, 33, 34 and 35 is connected to a first suction device 29 to provide controlled suction force for picking the electronic device 40, 41, 42 or 43 from the wafer table 21. The first suction device 29 allows the respective first transfer heads 30, 31, 32, 33, 34, and 35 to hold the electronic device 40, 41, 42 or 43 during 180 degree rotation and also provides force necessary to place the electronic device 40, 41, 42 or 43 on the second transfer head 36, 37, 38 or 39 of the second rotary device 50 during the flipping process. The suction force can be created by a vacuum.

FIG. 4 depicts suction devices 51, 52, 53 and 54 connected to the second transfer head 39, 38, 37 and 36 of the second rotary device 50, respectively. The suction devices 51, 52, 53 and 54 are configured to provide force to the second transfer head 39, 38, 37 and 36 when picking the electronic device 40 from the first rotary device 20. It should be noted that the system 70 can have a single suction device connected to all second transfer heads 36, 37, 38, and 39 to provide controlled suction to pick the electronic device 40, 41, 42 or 43 from the first rotary device 20. Further, the single suction device allows the second transfer heads to hold electronic device 43, 44, 45 or 46 during 180 degree rotation and is configured to provide sufficient force to place the electronic device 43, 44, 45, or 46 on the handling device 60. In one embodiment, each second transfer head 36, 37, 38, 39 is connected to one suction device 51, 52, 53 or 54 to provide controlled suction force to pick the electronic device from the first rotary device 20. Individual suction devices allow the respective second transfer heads 36, 37, 38, and 39 to hold the electronic device 43, 44, 45, or 46, and also to provide sufficient force to place the electronic device 43, 44, 45, or 46 on the handling device 60 during the flipping process. A vacuum can be used to create the suction force. In one embodiment, the suction devices 51, 52, 53 and 54 are connected to one or more vacuum pipettes 55 and 56 to provide sufficient vacuum force to hold, pick, and/or place the electronic device during the flipping process.

The transfer system 70 can be controlled by a controller (not shown) via manual operation or software to perform flipping and checking of the electronic devices 40, 41, 42 and 43. The inclined first rotary device 20 and inclined wafer table 21 increase the operation space of the transfer system 70. The inclined first rotary device 20 can be configured to provide space for multiple checking stations 22, 23 and 24 during flipping, or index rotation, of the electronic device 40, 41, 42 or 43, and allow the operator to clearly and easily observe the operating condition of the transfer system 70. As the transfer system 70 uses two rotary devices 20 and 50 with multiple transfer heads, the flipping process can be performed at higher speeds, which in turn increases the UPH. The inclined wafer table 21 provides space for the first imaging device 64, such that the first light source 27 and the first reflecting device 28 increase the inspection time of the electronic devices 40, 41, 42 or 43 when picking from the wafer table 21.

It should be noted that in one embodiment, the wafer table 21 is oriented at an angel ($\alpha°$) from horizontal, as depicted in FIG. 7. The surface of the wafer table 21 is at a substantially right angle with respect to the axis of the first transfer head 30 configured to pick the electronic device 40. The second transfer heads 36, 37, 38 and 39 of the second rotary device 50 are vertically oriented. In another embodiment, the transfer system 70 has a home sensor to eliminate the error in every rotation. This prevents cumulative errors which can occur with other systems, particularly those that use more heads 70.

It will be appreciated that variations of the embodiments disclosed above and other features and functions, or alternatives thereof, may be combined into many other different systems or applications. It will also be appreciated by those skilled in the art that various other modifications, variations or improvements may be made.

Although the embodiments set forth in the current disclosure have been described in considerable detail to cover certain aspects, those skilled in the art will recognize that other versions of the embodiments set forth herein are also possible.

What is claimed is:

1. A transfer system for flipping and checking electronic devices, said transfer system comprising:
a wafer table inclined about a first angle with respect to a horizontal plane;
a first rotary device positioned at a second angle with respect to the horizontal plane, said first rotary device comprising a plurality of first transfer heads circumferentially arranged around said first rotary device, said first transfer heads configured to pick and hold said electronic devices from said wafer table and transfer said electronic devices to a second rotary device;
the second rotary device being rotatable about a vertical axis, said second rotary device comprising a plurality of second transfer heads vertically arranged on a circumference of said second rotary device, said second rotary device configured to pick said electronic devices from said first rotary device and transfer said electronic devices to a handling device;
a first imaging device to inspect said electronic devices to be picked from the wafer table, wherein said first imaging device comprises a camera, a first light source, and a first reflecting device, wherein said first reflecting device is configured to increase an inspection time of said electronic devices when picking said electronic devices from said wafer table;

a second imaging device to inspect said electronic devices to be placed on the handling device;

a plurality of check stations positioned around said first and second rotary devices, said plurality of check stations configured to check at least one parameter of said electronic devices held by at least one of said first and second transfer heads; and wherein said wafer table is at a substantially right angle with respect to the axis of said first transfer heads.

2. The transfer system of claim 1, wherein said first angle is 30 degrees.

3. The transfer system of claim 1, wherein each of said first transfer heads rotate 180 degrees.

4. The transfer system of claim 1, wherein said electronic devices include integrated circuits and semiconductor chips.

5. The transfer system of claim 1, wherein said first angle is between 1 and 89 degrees.

6. The transfer system of claim 1 wherein said first imaging device is positioned on a horizontal plane.

7. An apparatus for transferring electronic devices, comprising:

a. a wafer table for placing and storing electronic devices, said wafer table positioned at a 30 degree angle below horizontal;

b. a first rotary device, said first rotary device composed of a plurality of first transfer heads positioned around the circumference of the first rotary device and positioned at a 90 degree angle from the wafer table for picking electronic devices from the wafer table;

c. a second rotary device positioned horizontally, for receiving electronic devices from the first rotary device, said second rotary device composed of a plurality of second transfer heads positioned around the circumference of the second rotary device;

d. a handling device for receiving electronic devices from said second rotary device;

e. one or more imaging devices configured to inspect the electronic devices, wherein said one or more imaging device comprises a camera, a light source, and a reflecting device, wherein said reflecting device is configured to increase an inspection time of said electronic devices when picking said electronic devices from said wafer table; and f. one or more check stations configured to check at least one parameter of the electronic devices, wherein said electronic devices are flipped 180 degrees when transferred from said wafer table to said second rotary device.

8. The apparatus of claim 7, wherein said electronic devices include integrated circuits and semiconductor chips.

9. The apparatus of claim 7, wherein said first one or more imaging device is positioned on a horizontal plane.

* * * * *